United States Patent
Netsu et al.

(10) Patent No.: US 10,870,581 B2
(45) Date of Patent: Dec. 22, 2020

(54) REACTION FURNACE FOR PRODUCING POLYCRYSTALLINE SILICON, APPARATUS FOR PRODUCING POLYCRYSTALLINE SILICON, METHOD FOR PRODUCING POLYCRYSTALLINE SILICON, AND POLYCRYSTALLINE SILICON ROD OR POLYCRYSTALLINE SILICON INGOT

(71) Applicant: Shin-Etsu Chemical Co., Ltd., Tokyo (JP)

(72) Inventors: Shigeyoshi Netsu, Niigata (JP); Naruhiro Hoshino, Niigata (JP); Tetsuro Okada, Niigata (JP); Hiroshi Saito, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 16/845,779

(22) Filed: Apr. 10, 2020

(65) Prior Publication Data
US 2020/0239320 A1    Jul. 30, 2020

Related U.S. Application Data

(62) Division of application No. 15/501,715, filed as application No. PCT/JP2015/003820 on Jul. 29, 2015.

(30) Foreign Application Priority Data

Sep. 4, 2014   (JP) ................................. 2014-179793

(51) Int. Cl.
C23C 16/24       (2006.01)
C01B 33/035      (2006.01)
(Continued)

(52) U.S. Cl.
CPC ............ *C01B 33/035* (2013.01); *B01J 19/087* (2013.01); *C23C 16/24* (2013.01); *C23C 16/46* (2013.01);
(Continued)

(58) Field of Classification Search
CPC ................... C01B 33/00; C01B 33/035; B01J 2219/0801; B01J 2219/0803; B01J 19/087; B01J 19/08; C23C 16/24; C23C 16/46
See application file for complete search history.

(56) References Cited

U.S. PATENT DOCUMENTS 6,221,155 B1 *   4/2001   Keck ....................... C23C 16/24
                                                          117/200
2013/0102092 A1   4/2013   Netsu et al.
(Continued)

FOREIGN PATENT DOCUMENTS

CN    102971624 A    3/2013
CN    103328380 A    9/2013
(Continued)

OTHER PUBLICATIONS

International Search Report dated Oct. 6, 2015 in PCT/JP2015/003820 filed Jul. 29, 2015.
(Continued)

*Primary Examiner* — Smita S Patel
(74) *Attorney, Agent, or Firm* — Oblon, McClelland, Maier & Neustadt, L.L.P.

(57) ABSTRACT

A reaction furnace for producing a polycrystalline silicon according to the present invention is designed so as to have an in-furnace reaction space in which a reaction space cross-sectional area ratio ($S=[S_O-S_R]/S_R$) satisfies 2.5 or more, which is defined by an inner cross-sectional area (So) of a reaction furnace, which is perpendicular to a straight
(Continued)

body portion of the reaction furnace, and a total sum ($S_R$) of cross-sectional areas of polycrystalline silicon rods that are grown by precipitation of polycrystalline silicon, in a case where a diameter of the polycrystalline silicon rod is 140 mm or more. Such a reaction furnace has a sufficient in-furnace reaction space even when the diameter of the polycrystalline silicon rod has been expanded, and accordingly an appropriate circulation of a gas in the reaction furnace is kept.

3 Claims, 5 Drawing Sheets

(51) Int. Cl.
*C23C 16/46* (2006.01)
*B01J 19/08* (2006.01)

(52) U.S. Cl.
CPC ............... *B01J 2219/0801* (2013.01); *B01J 2219/0803* (2013.01)

(56) References Cited

U.S. PATENT DOCUMENTS

| | | | |
|---|---|---|---|
| 2013/0302528 A1* | 11/2013 | Kurosawa | ............. C01B 33/035 427/457 |
| 2014/0134832 A1 | 5/2014 | Kurosawa et al. | |
| 2014/0302239 A1 | 10/2014 | Kurosawa et al. | |
| 2015/0017349 A1 | 1/2015 | Netsu et al. | |
| 2015/0294864 A1 | 10/2015 | Kurosawa et al. | |

FOREIGN PATENT DOCUMENTS

| | | |
|---|---|---|
| CN | 103702938 A | 4/2014 |
| CN | 103958406 A | 7/2014 |
| EP | 2 759 520 A1 | 7/2014 |
| EP | 2 818 450 A1 | 12/2014 |
| EP | 2 910 525 A1 | 8/2015 |
| JP | 2002-241120 A | 8/2002 |
| JP | 2006-206387 A | 8/2006 |
| JP | 2010-155782 A | 7/2010 |
| JP | 2011-231005 A | 11/2011 |
| JP | 2013-63884 A | 4/2013 |
| WO | WO 2012/098598 A1 | 7/2012 |
| WO | 2013042361 A1 | 3/2013 |
| WO | 2013125207 A1 | 8/2013 |
| WO | WO 2013/125207 A1 | 8/2013 |
| WO | WO 2014/061212 A1 | 4/2014 |

OTHER PUBLICATIONS

Extended European Search Report dated Feb. 20, 2018 in Patent Application No. 15838723.3, citing documents AA and AO-AR therein, 9 pages.

Combined Office Action and Search Report dated Sep. 3, 2018 in Chinese Patent Application No. 201580044611.9, citing documents AO-AR therein, 9 pages (with English translation of categories of cited documents).

\* cited by examiner

REACTION FURNACE FOR PRODUCING POLYCRYSTALLINE SILICON, APPARATUS FOR PRODUCING POLYCRYSTALLINE SILICON, METHOD FOR PRODUCING POLYCRYSTALLINE SILICON, AND POLYCRYSTALLINE SILICON ROD OR POLYCRYSTALLINE SILICON INGOT

TECHNICAL FIELD

The present invention relates to a technology for producing a polycrystalline silicon, and more specifically relates to a structure of a reaction furnace for producing the polycrystalline silicon by a Siemens method, and a method for producing the polycrystalline silicon using the reaction furnace.

BACKGROUND ART

Polycrystalline silicon is a raw material of a single crystal silicon substrate for manufacturing a semiconductor device, and of a silicon substrate for manufacturing a solar cell. The polycrystalline silicon is produced generally by a Siemens method which brings a source gas containing chlorosilane into contact with a heated silicon core wire, and precipitates the polycrystalline silicon on the surface of the silicon core wire by a chemical vapor deposition method (CVD: Chemical Vapor Deposition).

When the polycrystalline silicon is produced with the Siemens method, the silicon core wire is assembled into a guard frame shape (inverted U shape) from two wires in a vertical direction and one wire in a horizontal direction, in a reaction container (bell jar) having a dome shape, each of the ends of the silicon core wire in the guard frame shape is accommodated in a core wire holder, and these core wire holders are fixed to a pair of metal electrodes which are provided in a base plate, respectively. The silicon core wire is energized through the metal electrode and is heated by the passage of the electric current, the source gas comes in contact with the heated silicon core wire to precipitate as the polycrystalline silicon, and the polycrystalline silicon rod is obtained. Incidentally, a general reaction furnace is structured so that a plurality of sets of silicon core wires in the guard frame shape are arranged on the base plate.

The inner space of the bell jar is sealed by the base plate, and this sealed space serves as the reaction space in which the polycrystalline silicon grows by vapor deposition. The metal electrodes for energizing the silicon core wire penetrate through the base plate while sandwiching an insulator, and are connected to a power source which is provided below the bell jar, or are connected to metal electrodes for energizing another silicon core wire in the guard frame shape, which is arranged in the bell jar.

In order to prevent the polycrystalline silicon from precipitating on a portion other than the silicon core wire in the guard frame shape and to prevent a member that constitutes the reaction furnace from rising to an excessively high temperature and being damaged, the metal electrode, the base plate and the bell jar are cooled by a refrigerant such as water and a heat medium such as oil. Incidentally, the core wire holder is cooled through the metal electrode.

By the way, in recent years, along with an increase of a demand for the polycrystalline silicon, the reaction furnace is upsized progressively so as to increase a production amount, and a method of precipitating a large amount of polycrystalline silicon by one batch has been progressively adopted. Along with this tendency, the number of the silicon core wires has increased that are arranged in the reaction furnace. The structure of the large-sized reaction furnace is disclosed, for instance, in Japanese Patent Application Laid-Open No. 2006-206387 (Patent Literature 1).

In addition, also the requirement to enhance the quality of the polycrystalline silicon has become severer year by year, and it has been requested to control crystal characteristics as well, in addition to a request to further reduce impurities.

When the number of the silicon core wires increases that are installed in the bell jar, it becomes difficult to stably supply a source gas onto the surface of each of the polycrystalline silicon rods that are being grown in the furnace. When the supply of the source gas becomes nonuniform, unevenness occurs on the surface of the silicon rod, and as a result, the thickness of the silicon rod becomes nonuniform and a defective shape occurs. In addition, the fine unevenness which has occurred on the surface of the silicon rod promotes an abnormal growth of the polycrystalline silicon, and produces a so-called popcorn, which causes deterioration in the quality.

In order to suppress the occurrence of such a popcorn, it is effective to lower the surface temperature of the silicon rod, and at the same time to lower the concentration of silane which is supplied as the silicon raw material. However, in this case, the silane concentration in the boundary layer of crystal precipitation tends to easily become nonuniform, there are problems not only that it becomes difficult to control a grain size distribution, but also that the precipitation rate of the polycrystalline silicon becomes slower and the deterioration of the productivity is caused.

In order to make the grain size more dense and enhance the quality while enhancing productivity, it is effective to increase the concentration of the source gas to be supplied, but when it is intended to achieve the above described condition in a reaction container (reaction furnace) having a conventional structure, the gas temperature in the furnace rises, an excessive vapor-phase decomposition reaction occurs, and a silicon powder results in occurring in the chamber, which causes deterioration of the quality of the polycrystalline silicon rod.

Against the background of those circumstances, various techniques are proposed as a method for efficiently supplying the source gas to the surface of the silicon rod.

In techniques which are disclosed in Japanese Patent Application Laid-Open No. 2010-155782 (Patent Literature 2) and Japanese Patent Application Laid-Open No. 2002-241120 (Patent Literature 3), for instance, the positions of a source gas supply nozzle and an exhaust port of a reaction exhaust gas are variously devised, and thereby a precipitation reaction is enabled to progress efficiently.

However, any of these techniques has an aspect in which the source gas that has been supplied into the reaction furnace from the source gas supply nozzle is discharged from the exhaust port of the reaction exhaust gas in a state close to one pass.

As the diameter becomes large along with the growth of the silicon rod, an effective vapor growth reaction space of the polycrystalline silicon (specifically, an area except the total sum of the cross-sectional areas of the polycrystalline silicon rods that are being grown, in the inner cross-sectional area of the reaction furnace, which is perpendicular to the straight body portion of the reaction furnace) gradually decreases, and accordingly a flow state of the source gas on the surface of the silicon rod changes. However, in the above described conventional techniques, such a change of the flow state of the source gas is not considered, and accordingly the techniques are not sufficient from the viewpoint of the stable production of the polycrystalline silicon.

CITATION LIST

Patent Literature

Patent Literature 1: Japanese Patent Application Laid-Open No. 2006-206387
Patent Literature 2: Japanese Patent Application Laid-Open No. 2010-155782
Patent Literature 3: Japanese Patent Application Laid-Open No. 2002-241120

SUMMARY OF INVENTION

Technical Problem

The present invention is designed with respect to such problems, and an object is to provide a reaction furnace having a structure by which it becomes possible to control the concentration of a reaction gas and a temperature of the gas in a boundary layer of silicon precipitation to an appropriate range, even in the case where the diameter of the polycrystalline silicon rod to be grown has been expanded, and to contribute to a stable production of polycrystalline silicon.

Solution to Problem

In order to solve the above described problem, the reaction furnace for producing the polycrystalline silicon according to the present invention is a reaction furnace for producing a polycrystalline silicon by a Siemens method, and has an in-furnace reaction space in which when an inner cross-sectional area of the reaction furnace, which is perpendicular to a straight body portion of the reaction furnace, is represented by $S_0$, and a total sum of cross-sectional areas of polycrystalline silicon rods that are grown by precipitation of the polycrystalline silicon onto at least one pair of silicon core wires in an inverted U shape, which are arranged in the reaction furnace, is represented by $S_R = \Sigma S_i$, a reaction space cross-sectional area ratio that is defined by $S=[S_0-S_R]/S_R$ satisfies 2.5 or more, in a case where a diameter of the polycrystalline silicon rod is 140 mm or more.

The apparatus for producing the polycrystalline silicon according to the present invention includes the reaction furnace.

In addition, a method for producing the polycrystalline silicon according to the present invention is a method for producing a polycrystalline silicon by a Siemens method, and includes: using the reaction furnace; and controlling a composition ratio in wt % between trichlorosilane (TCS) and silicon tetrachloride (STC) in an exhaust gas to 1.2 or more, in a reaction process up to the time when a diameter of a polycrystalline silicon rod that is growing reaches 100 mmφ.

In addition, the method for producing the polycrystalline silicon according to present invention is a method for producing a polycrystalline silicon by a Siemens method, and includes: using the reaction furnace; supplying an electric current at a high frequency between 50 Hz and 10,000 kHz to a silicon core wire in an inverted U shape; and controlling a temperature within a 100 mmφ vicinity of the core to 1400° C. or lower, until a polycrystalline silicon rod grows to a predetermined diameter.

Advantageous Effects of Invention

The reaction furnace for producing the polycrystalline silicon according to the present invention is designed so as to have an in-furnace reaction space in which a reaction space cross-sectional area ratio $(S=[S_0-S_R]/S_R)$ satisfies a particular condition, which is defined by an inner cross-sectional area (So) of a reaction furnace, which is perpendicular to a straight body portion of the reaction furnace, and a total sum $(S_R)$ of cross-sectional areas of polycrystalline silicon rods that are grown by precipitation of the polycrystalline silicon, and accordingly an appropriate circulation of a gas in the reaction furnace is kept.

As a result, according to the present invention, the reaction furnace is provided that has the structure by which it becomes possible to control the concentration of the reaction gas and a temperature of the gas in the boundary layer of the silicon precipitation to an appropriate range, even in the case where the diameter of the polycrystalline silicon rod to be grown has been expanded, and contributes to a stable production of polycrystalline silicon.

DESCRIPTION OF EMBODIMENTS

Figure 1:
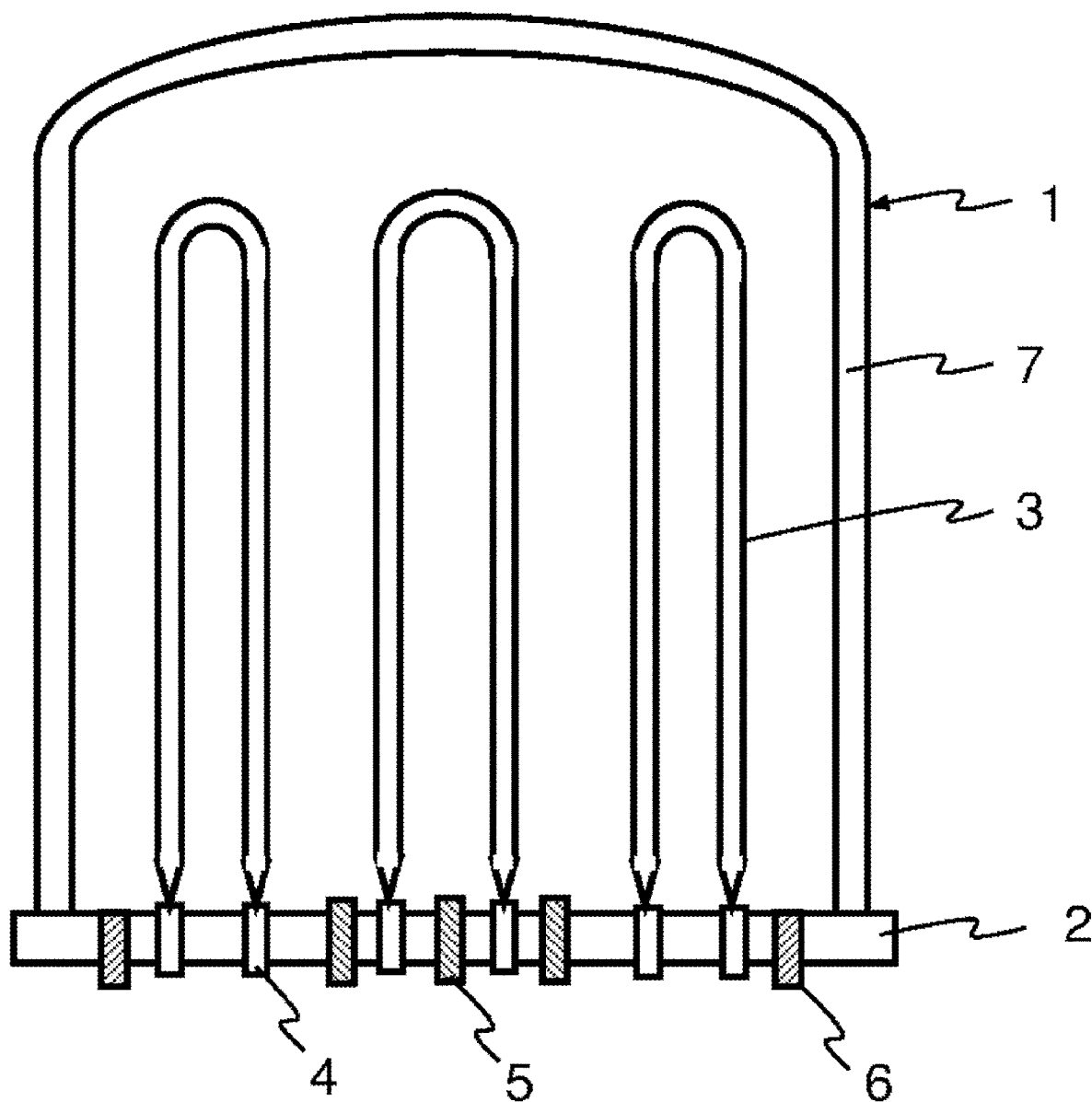
FIG. 1 is a schematic sectional view for showing a structure example of a reaction furnace for producing a polycrystalline silicon, according to the present invention.

An embodiment according to the present invention will be described below with reference to the drawings.
FIG. 1 is a schematic sectional view for showing a structure example of the reaction furnace for producing the polycrystalline silicon, which an apparatus for producing polycrystalline silicon according to the present invention has. A reaction furnace 100 has an inner part that is sealed by a bell jar 1 which is a reaction container in a dome shape and by a bottom plate 2, has a plurality of silicon core wires 3 which are assembled into a guard frame shape (inverted U shape) arranged in the sealed space, and precipitates the polycrystalline silicon on the surface of the silicon core wire 3. In the bottom plate 2, there are installed: core wire holders (not-shown) and metal electrodes 4 for passing an electric current from both ends of the silicon core wire 3 and heating the silicon core wire 3; a gas supply nozzle 5 for supplying a source gas into the inside of the bell jar 1; and a reaction exhaust gas port 6 for discharging the gas after reaction to the outside of the bell jar 1. Incidentally, the source gas of which the flow rate and the flow quantity have been controlled by a gas flow rate control unit (not-shown) is supplied from a gas outlet of the gas supply nozzle 5. In addition, as is shown in FIG. 1, it is preferable to provide a plurality of gas supply nozzles 5, but it is acceptable to provide a single nozzle.

Usually, the bottom plate 2 is discoid, a mixed gas of trichlorosilane and hydrogen is used as the source gas in many cases, and the reaction temperature is a comparatively high temperature of 900° C. to 1200° C. Accordingly, the bottom plate 2 and the bell jar 1 are cooled by water that flows in a cooling channel 7. Incidentally, an inner surface temperature of the bell jar 1 at the time of the precipitation reaction is approximately 100° C. to 300° C.

Figure 2:
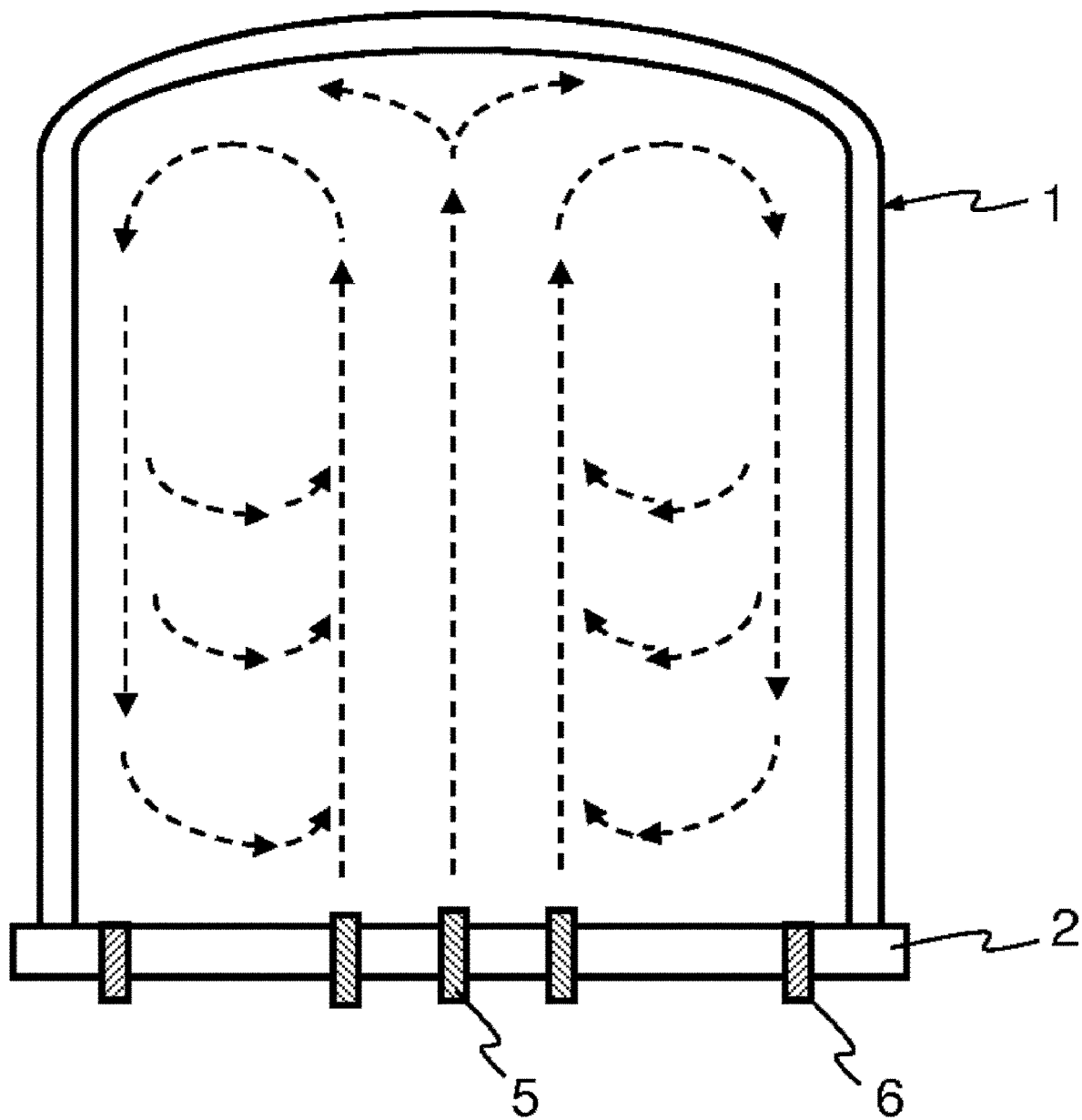
FIG. 2 is a view for schematically showing a flow of a gas, in a reaction space of the gas which has been supplied into a bell jar from a source gas supply nozzle.

FIG. 2 is a view for schematically showing a flow of the gas, in the reaction space of the gas which has been supplied into the bell jar 1 from the source gas supply nozzle 5. The source gas which has been spouted from the source gas supply nozzle 5 moves up in the reaction space while entraining a reaction gas which flows down along the inner wall of the bell jar 1. This ascending gas flow collides with the upper head inner wall of the bell jar 1, changes to a descending flow, becomes a circulating flow, and moves down along the inner wall of the bell jar 1. Then, a part of the descending gas flow moves up again in the reaction space, together with the source gas which has been spouted from the source gas supply nozzle 5.

As the polycrystalline silicon precipitates onto the silicon core wire 3, the diameter of the polycrystalline silicon rod is expanded, but the gas in the reaction space circulates in the chamber 1 in such a way that an ascending gas current occurs in the vicinity of the polycrystalline silicon rod, whereas a descending gas current occurs in a place separated from the polycrystalline silicon rod. In order to produce a polycrystalline silicon rod of high quality by a Siemens method, it is necessary to appropriately keep the circulation of the gas in the reaction space until the precipitation process ends, and to promote a stable growth of a silicon cluster in a boundary layer on the surface of the silicon rod, on which the polycrystalline silicon precipitates.

In the precipitation reaction of the polycrystalline silicon, main factors that give influence on a precipitation rate of the polycrystalline silicon, a shape of the polycrystalline silicon rod, and crystal characteristics (grain size, size and amount of needle-shaped crystal, and the like) are a surface temperature of the silicon rod at the time of the precipitation reaction, a pressure in the reaction furnace, and the concentration of the trichlorosilane in the boundary layer of precipitation in the vicinity of the surface of the silicon rod, on which the silicon cluster is produced. In order to suppress the occurrence of the popcorn originating in the unevenness of the surface of the silicon rod, keep the adequate surface shape, and control characteristics of the precipitated crystal, it is important to appropriately control the above described factors in the precipitation process of the polycrystalline silicon.

However, in a conventional reaction furnace, the diameter of the polycrystalline silicon rod occasionally increases from approximately 5 mm in an initial stage of the precipitation process to 200 mm or larger in a last stage of the precipitation process. In other words, in the precipitation process, the reaction space inevitably decreases along with the expansion of the diameter of the polycrystalline silicon rod, and as a result, a temperature distribution and a flow pattern of the gas in the reaction furnace change.

In particular, along with the upsizing of the reaction furnace, the flow of the gas in the furnace becomes complicated and local stay tends to easily occur, which tend to easily cause the distribution of the gas concentration in the furnace and a local abnormal rise of the temperature. Such a local abnormal rise of the temperature increases the variation in the particle size distribution, and also becomes causes of the local occurrence of the popcorn, and the occurrence of silicon powders that are caused by a vapor-phase decomposition reaction, during the reaction. Because of this, it is desirable to prevent a local stay portion from being formed in the reaction furnace, by forming the circulating flow that is caused by a large amount of the reaction gas.

However, the conventional reaction furnace has been designed almost in no consideration of a change of the reaction space (in other words, change of circulation state of reaction gas), which accompanies the expansion of the diameter of the polycrystalline silicon rod, and accordingly it has been difficult to optimize the gas temperature in the boundary layer of the precipitation and the supply condition of the source gas.

Then, in the present invention, the reaction furnace is designed so as to have an in-furnace reaction space in which when an inner cross-sectional area of the reaction furnace (bell jar 1), which is perpendicular to a straight body portion of the reaction furnace, is represented by $S_O$, and a total sum of cross-sectional areas of polycrystalline silicon rods that are grown by precipitation of the polycrystalline silicon onto at least one pair of silicon core wires in an inverted U shape, which are arranged in the reaction furnace, is represented by $S_R=\Sigma S_i$, a reaction space cross-sectional area ratio that is defined by $S=[S_O-S_R]/S_R$ satisfies 2.5 or more, in a case where a diameter of the polycrystalline silicon rod is 140 mm or more.

Figure 3:
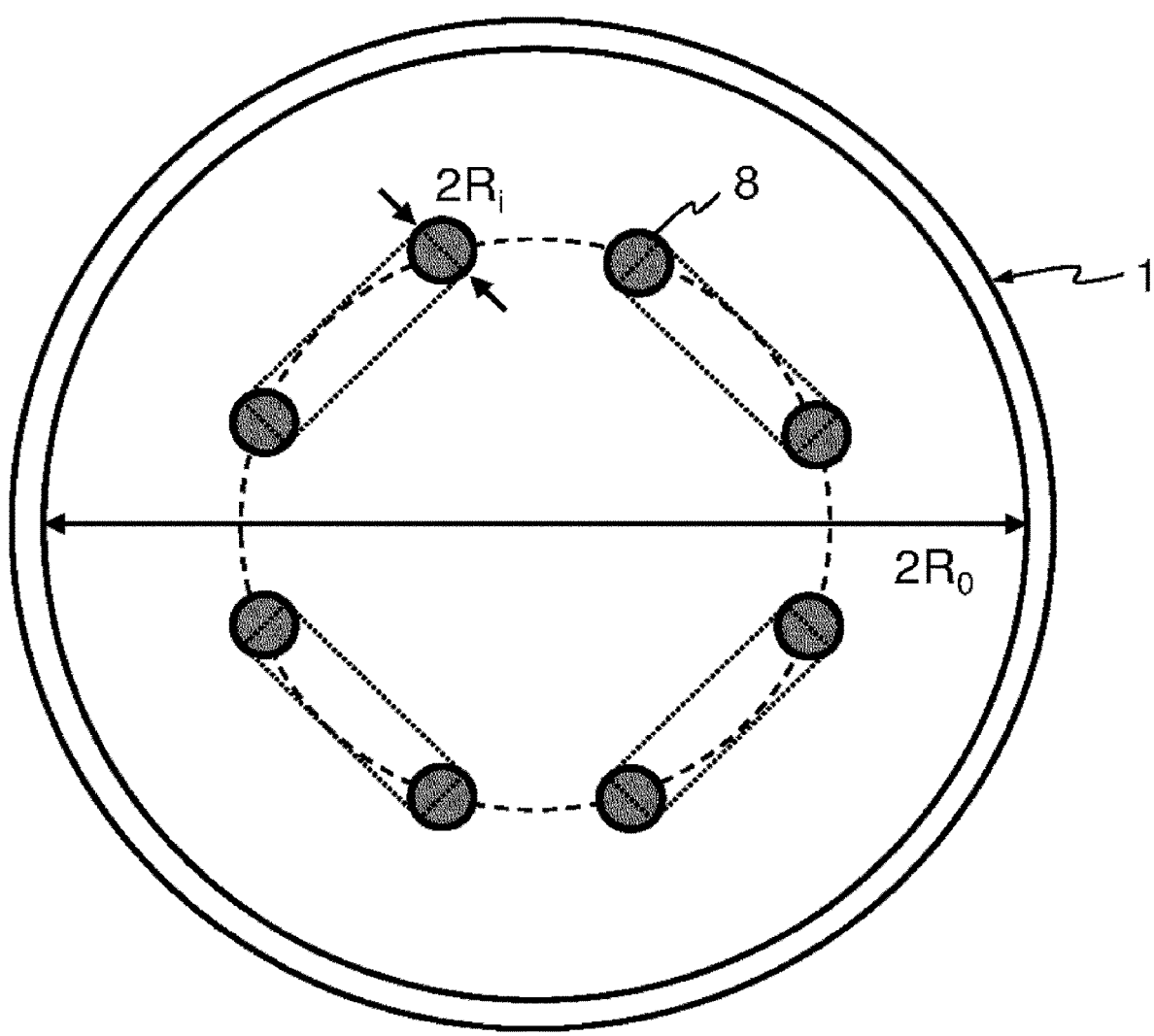
FIG. 3 is a schematic sectional view that is perpendicular to a straight body portion, for showing a structure example of the reaction furnace for producing the polycrystalline silicon, according to the present invention.

FIG. 3 is a schematic sectional view that is perpendicular to a straight body portion, for showing a structure example of the reaction furnace for producing the polycrystalline silicon, according to the present invention. Reference numeral 8 in FIG. 3 denotes a polycrystalline silicon rod that is obtained due to the precipitation of the polycrystalline silicon on the silicon core wire in the inverted U shape. In the example shown in FIG. 3, four silicon core wires are arranged on a concentric circle in the furnace.

The inner diameter of the reaction furnace which is perpendicular to the straight body portion of the reaction furnace 1 is $2R_O$, and accordingly the inner cross-sectional area $S_O$ is $\pi R_O^2$. Suppose that any diameter of the polycrystalline silicon rods 8 in such a state that the polycrystalline silicon has precipitated on four pairs of the silicon core wires in the inverted U shape is represented by $2R_i$, which are arranged in the reaction furnace 1, the total sum of the cross-sectional areas ($\pi R_i^2$) becomes $S_R=\Sigma S_i=4\pi R_i^2$. Accordingly, the reaction space cross-sectional area ratio S according to the above described definition becomes $[S_O-S_R]/S_R$.

In the present invention, the size of the reaction furnace and the number of the silicon core wires that are arranged in the furnace are determined so as to have the reaction space satisfying the above described condition, and as a result, the circulation of the gas in the reaction space is appropriately kept, and the stable growth of the silicon cluster in the boundary layer can be promoted, until the precipitation process of the polycrystalline silicon ends.

In addition, if a preferable circulating flow of the reaction gas is formed in the furnace, the reaction gas is efficiently cooled, and the production of the silicon powder is suppressed that is a by-product of the chlorosilane. In a case where the source gas has been supplied in which the concentration of the trichlorosilane is 30 mol % or more, when the reaction gas temperature locally exceeds 600° C., a large amount of the silicon powder that is the by-product of the chlorosilane is produced in the furnace. When such the silicon powder has been produced, the silicon powder deposits once on the inner wall surface of the bell jar made from metal, and exfoliates and deposits on the silicon rod, which becomes a cause of heavy metal contamination. Moreover, the silicon powder which has deposited on the surface of the silicon rod also becomes a cause of an abnormal growth of the polycrystalline silicon, which shows a protruding shape.

Usually, the surface temperature of the polycrystalline silicon rod during the precipitation reaction is as high as approximately 900 to 1,200° C., and accordingly in such an environment that the reaction gas locally stays in the furnace, the temperature of the reaction gas also results in rising to approximately 900 to 1,200° C., and the above described silicon powder is remarkably produced. Because of this, it is necessary to keep the reaction gas temperature at approximately 600° C. or lower. When the circulating flow is formed that is caused by a large amount of the reaction gas in the reaction furnace, the reaction gas of which the temperature has been raised once can be efficiently brought into contact with the inner wall of the bell jar that has been cooled by a coolant such as water, and accordingly the reaction gas is efficiently cooled.

The present inventors have made an extensive investigation in order to form the above described preferable reaction gas circulating flow in the furnace, and as a result, have determined to design the reaction furnace so as to have an in-furnace reaction space in which a reaction space cross-sectional area ratio defined by $S=[S_0-S_R]/S_R$ satisfies 2.5 or more, when the diameter of the polycrystalline silicon rod is 140 mm or more.

In the reaction furnace which has been designed in the above way, it becomes possible to form the circulating flow that is caused by a large amount of the reaction gas in the furnace. As a result, the reaction gas is efficiently cooled, the local rise of the gas temperature is suppressed, and the production of the silicon powder can be suppressed.

The control of the particle size distribution of the polycrystalline silicon that is obtained by the precipitation is one of useful factors for enhancing the quality of the polycrystalline silicon rod, and the higher is the chlorosilane concentration of the reaction gas which is supplied into the furnace, the easier is the control. However, as has been described above, in the conventional reaction furnace, the local stay of the reaction gas in the furnace tends to easily occur, and accordingly there has been a problem that if the chlorosilane concentration of the reaction gas has been enhanced, the production of the silicon powder is caused.

In contrast to this, in the reaction furnace according to the present invention, the circulating flow is formed that is caused by a large amount of the reaction gas in the furnace, and accordingly the local stay of the reaction gas is hard to occur. Accordingly, there is an advantage that even when the chlorosilane concentration of the reaction gas is enhanced which is supplied into the furnace, the above described problem is hard to occur. The chlorosilane concentration of the reaction gas that is supplied into the furnace shall be evaluated by the trichlorosilane (TCS) and the silicon tetrachloride (STC) in the exhaust gas, and then even when the composition ratio in wt % between the TCS and the STC has increased, the polycrystalline silicon rod can be grown without the silicon powder being produced.

The present inventors have repeatedly conducted experiments in which the polycrystalline silicon rods have been grown to the final diameter of approximately 200 mm, and as a result, have obtained a conclusion that a polycrystalline silicon rod of high quality is obtained by an operation of controlling the composition ratio in wt % between the trichlorosilane (TCS) and the silicon tetrachloride (STC) in the exhaust gas to 1.2 or more, in the reaction process up to the time when the diameter of the polycrystalline silicon rod that is growing reaches 100 mmφ.

Incidentally, from the viewpoint of optimizing the reaction space cross-sectional area ratio, it is desirable to set the reaction furnace at such a state that a linear velocity does not excessively rise even when the flow rate of the reaction gas to be supplied has increased, and specifically that the linear velocity becomes 0.3 m/s or less. When the linear velocity of the gas excessively rises, convective heat transfer becomes large, the gas concentration in the boundary layer becomes thin, and the gas temperature rises. Moreover, it is necessary to increase an electric power to be applied so as to keep the surface temperature of the polycrystalline silicon rod, but when the diameter of the silicon rod is large, the increased electric power also becomes a cause of causing a problem that the central part melts.

In addition, it is important to consider a distance between the polycrystalline silicon rods that are being grown in the furnace so as not to become excessively close to each other. When the distance between the adjacent silicon rods is excessively close to each other, the in-furnace gas temperature tends to easily rise, and the inside of the furnace becomes an environment in which the silicon powder tends to be easily produced. Specifically, it is desirable to secure a mutual distance of 75 mm or more in between the polycrystalline silicon rods.

When the diameter of the polycrystalline silicon rod that is growing becomes 120 mmφ or larger, the central temperature of the silicon rod gradually rises. Generally, when the temperature of the polycrystalline silicon becomes 1200° C. or higher, the recombination of the crystals starts, and the grain size becomes large. In addition, the melting point of the polycrystalline silicon is approximately 1420° C., and accordingly when the central temperature exceeds 1400° C., there is a possibility that the vicinity of the center of the polycrystalline silicon rod is melted and the melt leads to an accident. Accordingly, it is necessary to appropriately control an amount of the electric current which flows near the center of the polycrystalline silicon rod, and to keep the temperature of the portion to an appropriate range.

A preferable embodiment includes supplying the electric current from a high-frequency power source, and heating the polycrystalline silicon rod by applying a high-frequency skin effect. Specifically, the high-frequency electric current at 50 Hz to 10,000 kHz is supplied to the silicon core wire and the temperature of a portion within the 100 mmφ vicinity of the core to 1400° C. or lower, until the polycrystalline silicon rod grows to the predetermined diameter.

The polycrystalline silicon rod is produced with the use of the above described reaction furnace, and is pulverized into a polycrystalline silicon ingot, as needed.

EXAMPLE

The polycrystalline silicon rod was grown by the Siemens method with the use of a reaction furnace of which the straight body portion had a height of 2.1 m and the inner diameter of 0.6 m. In the example, two sets of silicon core wires were arranged in the furnace, in the comparative example, six sets of silicon core wires were arranged in the furnace, and the polycrystalline silicon rods with a diameter of approximately 140 mm were grown. As for the above described reaction space cross-sectional area ratio S, when the final diameter of the polycrystalline silicon rod is determined to be 140 mm, S becomes 8.2 in the example, and S becomes 2.1 in the comparative example.

The reaction gases which were supplied into the furnaces, respectively, in the example and the comparative example were determined to be a mixed gas of trichlorosilane and hydrogen (25 mol % trichlorosilane concentration), and the silicon core wire (polycrystalline silicon rod) was heated by a supplied high-frequency electric current at a frequency of 15 kHz. The reaction temperature was 1020° C. and the in-furnace pressure at the time of the precipitation reaction was 0.5 MPa. The precipitation time period was 165 hours in the example and was 177 hours in the comparative example, and the final diameter of the polycrystalline silicon rod was 143 mm in the example and was 145 mm in the comparative example.

Figure 4:
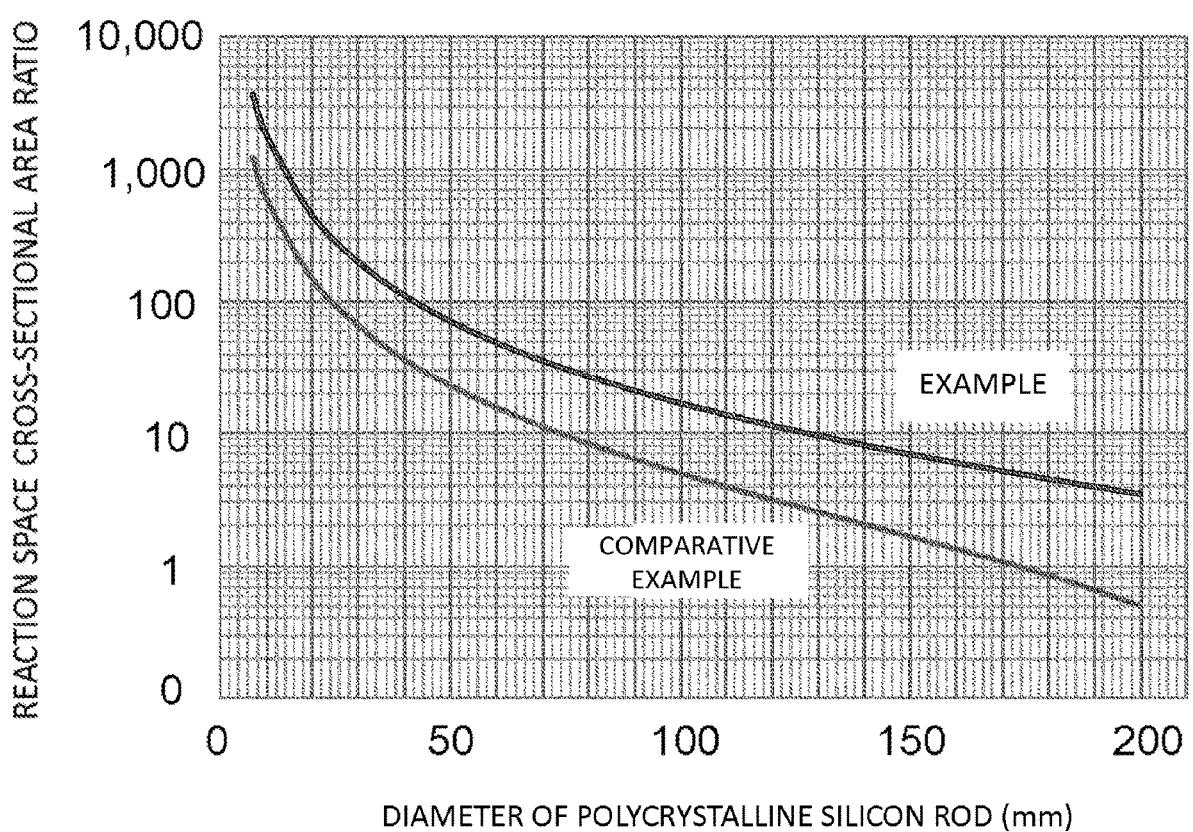
FIG. 4 is a view showing a change of a space cross-sectional area ratio along with the growth of a polycrystalline silicon, in each of an example and a comparative example.

FIG. 4 is a view showing a change of a space cross-sectional area ratio along with the growth of a polycrystalline silicon, in each of the example and the comparative example. FIG. 4 shows the calculation result of the change up to the time when the diameter of the polycrystalline silicon rod reached 200 mm, where the actual precipitation process was finished when the diameter had reached approximately 140 mm, as has been described above.

As is understood from FIG. 4, in the reaction furnace of the example, the reaction space cross-sectional area ratio defined by $S=[S_0-S_R]/S_R$ was 2.5 or more when the diameter of the polycrystalline silicon rod was 140 mm or more, but in the reaction furnace of the comparative example, the reaction space cross-sectional area ratio was already below 2.5 at the time when the diameter of the polycrystalline silicon rod had reached 140 mm.

Figure 5:
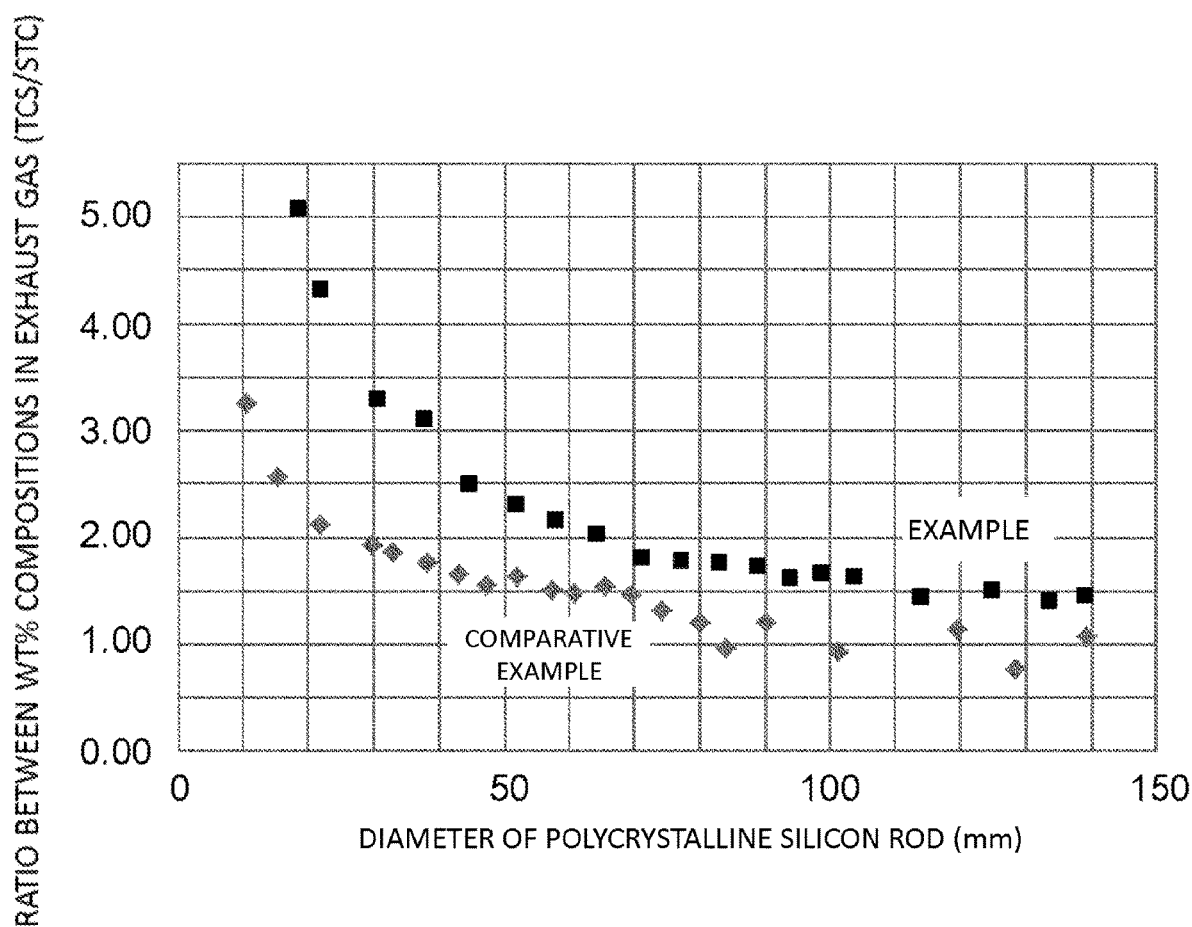
FIG. 5 is a view showing a result of having actually measured a change of a composition ratio in wt % between TCS and STC in an exhaust gas, in each of the example and the comparative example.

FIG. 5 is a view showing a result of having actually measured a change of a composition ratio in wt % between TCS and STC in an exhaust gas, in each of the example and the comparative example.

As is understood from FIG. 5, in the production method of the example, the composition ratio in wt % between the TCS and the STC in the exhaust gas (TCS/STC) was 1.2 or more up to the time when the precipitation process was completed, but in the production method of the comparative example, the ratio was already below 1.2 at the time when the diameter of the polycrystalline silicon rod had reached approximately 100 mm. Incidentally, when the TCS/STC ratio is evaluated at the time when the diameter of the polycrystalline silicon rod has reached 100 mm, in the reaction furnace of the example, the TCS/STC ratio is 1.6, and in the reaction furnace of the comparative example, the TCS/STC ratio is 1.0.

The characteristics of the polycrystalline silicon rod that grew in the above way (incidence rate of popcorn, X-ray diffraction intensity of (111) plane of sample that has been collected from vicinity of silicon core wire, and grain size distribution that has been evaluated by electron beam back scattering diffraction method (EBSD)) were evaluated. The results are summarized in Table 1. Incidentally, the X-ray diffraction intensity of the (111) plane is an indicator which evaluates a degree of crystal orientation, and means that the crystals are randomly oriented as the X-ray diffraction intensity is smaller.

TABLE 1

|  | Example | Comparative example |
|---|---|---|
| Height of straight body portion of reaction furnace | 2.1 m | 2.1 m |
| Inner diameter of straight body portion | 0.6 m | 0.6 m |
| Reaction temperature | 1020° C. | 1020° C. |
| Reaction pressure | 0.5 MPaG | 0.5 MPaG |
| Number of sets of silicon core wires | 2 | 6 |
| Reaction space cross-sectional area ratio (140 mmϕ) | 8.2 | 2.1 |
| Frequency of electric current | 15 KHz | 15 KHz |
| Final diameter of silicon rod | 143 mm | 145 mm |
| Reaction time period | 165 hours | 177 hours |
| Type of source gas | Trichlorosilane + hydrogen | Trichlorosilane + hydrogen |
| Trichlorosilane concentration (Mol %) | 25% | 25% |
| Exhaust gas TCS/STC (100 mmϕ) | 1.6 | 1.0 |
| Incidence rate of popcorn | 5% | 55% |
| X-ray diffraction intensity in vicinity of core (111) | Small | Large |

| Grain size distribution (%: EBSD evaluation) | Vicinity of core | Surface | Vicinity of core | Surface |
|---|---|---|---|---|
| <0.5 μm | 0 | 0 | 0 | 0 |
| 0.5-3 μm | 39.3 | 33.6 | 39.4 | 59.2 |
| 3-5 μm | 29.9 | 27 | 29.6 | 30.3 |
| 5-10 μm | 22.6 | 28.6 | 28.1 | 9.8 |
| 10-30 μm | 4.8 | 5 | 2.9 | 0.7 |
| >30 μm | 3.3 | 5.8 | 0 | 0 |

| Particle size distributions in vicinity of core and on surface | Small: Distribution between 0.5 and 10 μm is uniform. | Large: Distribution one-sided to 5 μm on surface |
|---|---|---|
| Incidence rate of crack in silicon rod | 0% | 60% |

Incidentally, an incidence rate of crack the silicon rod at the time when a plurality of similar experiments have been repeatedly conducted was 0% in the silicon rod of the example, but in contrast to this, the incidence rate of crack was 60% in the silicon rod of the comparative example.

It is understood from the result shown in this table that the polycrystalline silicon rod has high quality, which has been grown with the use of the reaction furnace according to the present invention.

This is because the reaction furnace for producing the polycrystalline silicon according to the present invention is designed so as to have an in-furnace reaction space in which a reaction space cross-sectional area ratio ($S=[S_O-S_R]/S_R$) satisfies a particular condition, which is defined by an inner cross-sectional area ($S_O$) of the reaction furnace, which is perpendicular to a straight body portion of the reaction furnace, and a total sum ($S_R$) of cross-sectional areas of polycrystalline silicon rods that are grown by precipitation of the polycrystalline silicon, and accordingly an appropriate circulation of a gas in the reaction furnace is kept.

INDUSTRIAL APPLICABILITY

According to the present invention, the reaction furnace is provided that has a structure by which it becomes possible to control the concentration of the reaction gas and the temperature of the gas in the boundary layer of the silicon precipitation to an appropriate range, even in the case where the diameter of the polycrystalline silicon rod to be grown has been expanded, and contributes to a stable production of the polycrystalline silicon.

REFERENCE SIGNS LIST

100 Reaction furnace
1 Bell jar
2 Bottom plate
3 Silicon core wire
4 Metal electrode
5 Gas supply nozzle
6 Reaction exhaust gas port
7 Cooling channel
8 Polycrystalline silicon rod

The invention claimed is:

1. A reaction furnace for producing a polycrystalline silicon by a Siemens method, wherein
the reaction furnace has an in-furnace reaction space in which when an inner cross-sectional area of the reaction furnace, which is perpendicular to a straight body portion of the reaction furnace, is represented by $S_O$, and a total sum of cross-sectional areas of polycrystalline silicon rods that are grown by precipitation of the polycrystalline silicon onto at least one pair of silicon core wires in an inverted U shape, which are arranged in the reaction furnace, is represented by $S_R=\Sigma S_i$,
a reaction space cross-sectional area ratio that is defined by $S=[S_O-S_R]/S_R$ satisfies 2.5 or more, based on a final diameter, which is 140 mm or more, of the polycrystalline silicon rod.

2. An apparatus for producing a polycrystalline silicon, comprising the reaction furnace according to claim 1.

3. The reaction furnace, according to claim 1, further comprising a source gas supply nozzle for supplying source gas in the in-furnace reaction space, wherein
the source gas supplied from the source gas supply nozzle is controlled such as a composition ratio in wt % between trichlorosilane (TCS) and silicon tetrachloride (STC) in an exhaust gas to 1.2 or more, until a diameter of a polycrystalline silicon rod that is growing reaches 100 mmφ.

* * * * *